US006653665B2

(12) United States Patent
Kajiyama

(10) Patent No.: US 6,653,665 B2
(45) Date of Patent: Nov. 25, 2003

(54) MEMORY DEVICE

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/073,338

(22) Filed: Feb. 13, 2002

(65) Prior Publication Data

US 2002/0109150 A1 Aug. 15, 2002

(30) Foreign Application Priority Data

Feb. 13, 2001 (JP) ........................................ 2001-035145

(51) Int. Cl.[7] ........................ H01L 29/74; H01L 31/111
(52) U.S. Cl. ........................................ 257/133; 438/135
(58) Field of Search ................................ 257/133, 134, 257/137, 138, 139, 140, 141, 142, 143, 144, 145, 350, 370, 378, 557, 349, 124, 107, 288

(56) References Cited

U.S. PATENT DOCUMENTS

| 4,435,790 A | * | 3/1984 | Tickle et al. ................. 365/218 |
| 5,412,598 A | * | 5/1995 | Shulman ....................... 365/174 |
| 5,635,744 A | * | 6/1997 | Hidaka et al. ................. 257/349 |
| 5,994,739 A | * | 11/1999 | Nakagawa et al. ........... 257/350 |
| 6,104,045 A | | 8/2000 | Forbes et al. |
| 6,107,659 A | * | 8/2000 | Onakado et al. ............. 254/318 |
| 6,329,690 B1 | * | 12/2001 | Morrett et al. ................ 257/350 |

FOREIGN PATENT DOCUMENTS

JP        06132468 A  *  5/1994

OTHER PUBLICATIONS

Farid Nemati, et al., Symposium on VLSI Technology Digest of Technical Papers, pp. 66–67, "A Novel High Density, Low Voltage SRAM Cell with a Vertical NDR Device", 1998.

Farid Nemati, et al., IEDM Tech. Dig., pp. 283–286, "A Novel Thyristor–Based SRAM Cell (T–RAM) for High––Speed, Low–Voltage, GIGA–Scale Memories", 1999.

* cited by examiner

Primary Examiner—Wael Fahmy
Assistant Examiner—Dana Farahani
(74) Attorney, Agent, or Firm—Oblon, Spivak, McClelland, Maier & Neustadt, P.C.

(57) ABSTRACT

A semiconductor device according to an aspect of the present invention includes a substrate having a semiconductor substrate and a semiconductor layer provided on the semiconductor substrate, said semiconductor layer being insulated by an insulating film; a thyristor with a gate, its pnpn structure being laterally formed in said semiconductor layer of said substrate; and a transistor formed in said semiconductor layer of said substrate; said transistor being connected to one terminal of said thyristor. A method of manufacturing a semiconductor device according to other aspect of the present invention includes defining an element forming region isolated by an element isolation insulation film in a semiconductor layer of a first conductivity type provided on a semiconductor substrate, said semiconductor layer being insulated by an insulation film provided on the semiconductor substrate; forming a second base region of a first conductivity type in said element forming region; forming a first gate electrode of the thyristor and a second gate of the transistor above said second base region, said first and second gate electrodes being arranged in parallel; implanting ions to form a source and drain diffused regions of the second conductivity at both sides of said second gate electrode, and to form, at the same time, a second emitter region of the second conductivity type and a first base region, one of said source and drain diffused regions and said second emitter region being common region; providing a hole penetrating said first base region and said insulating film under said base region; and filling said hole with material of the first conductivity type to obtain a plug member as a first emitter region which contacts said semiconductor substrate.

17 Claims, 19 Drawing Sheets

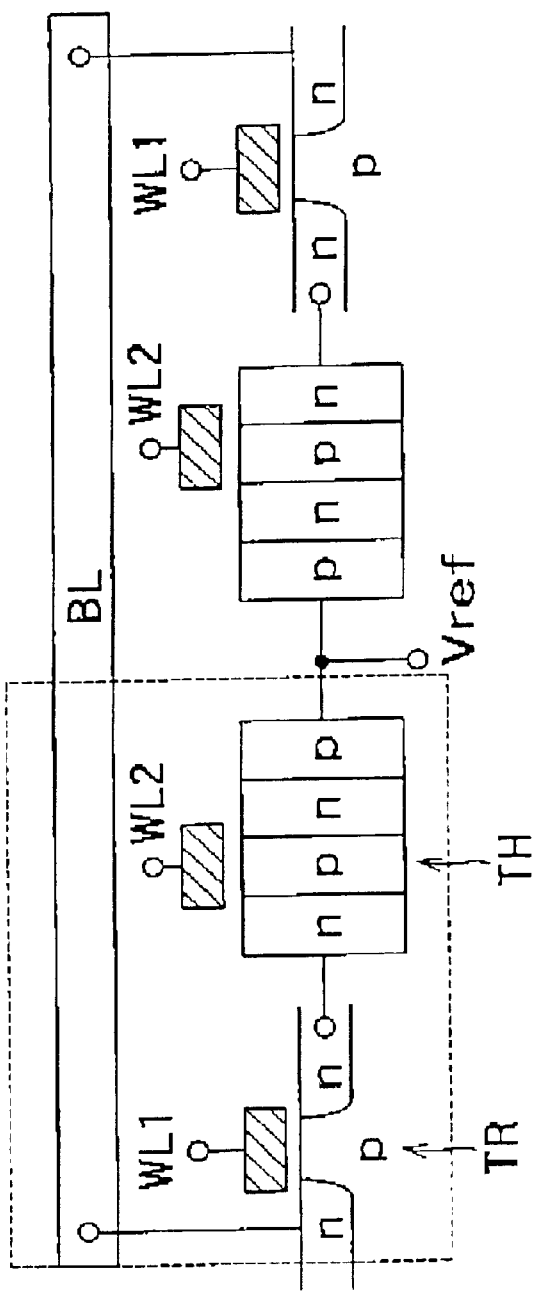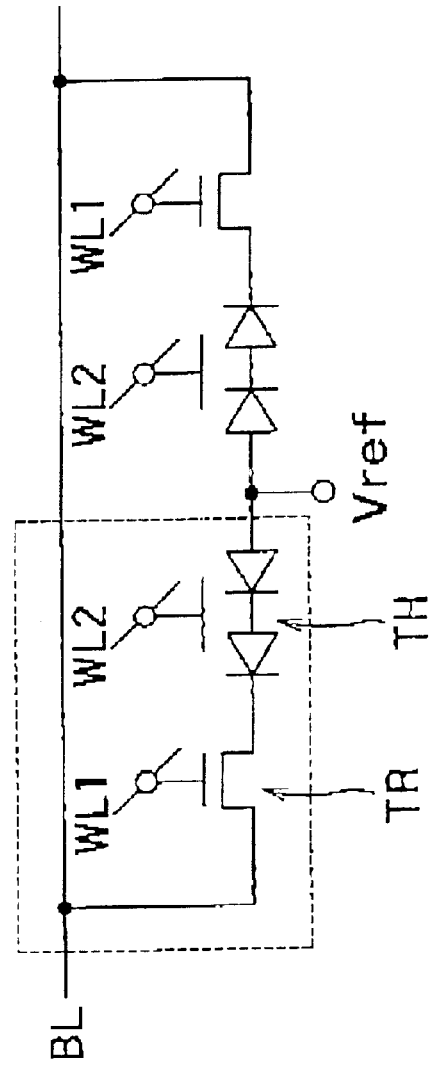
FIG. 3A
FIG. 3B

|  | WL1 | WL2 | BL |
|---|---|---|---|
| HOLD | VL | GND | GND |
| READ | Vdd | GND | GND |
| WRITE "0" | Vdd | Vdd | Vdd |
| WRITE "1" | Vdd | Vdd | GND |

BL: Vref<Vdd

MEMORY DEVICE

CROSS REFERENCE TO RELATED APPLICATION

This application is based upon and claims the benefit of priority from the prior Japanese Patent Application No. 2001-35145, filed on Feb. 13, 2001; the entire contents of which are incorporated herein by reference.

BACKGROUND OF THE INVENTION

This invention relates to a semiconductor device and its manufacturing method and more specifically to a memory device having memory cells in which each cell is composed of a thyristor with a gate and a transistor.

In these days, DRAM (Dynamic Random Access Memory) has progressed its miniaturization and as a result there arises difficulties in obtaining necessary capacitance, in decreasing leak current at turn-off of a transistor, and in holding data charge.

Furthermore, in forming DRAM using SOI (Silicon On Insulator) substrate, which is regarded as good selection in future, there is a problem in which high density integration is difficult, because of a large mismatching in processes for forming trench capacitors and stacked capacitors.

On the other hand, since SRAM does not employ capacitors, its affinity with the SOI substrate is good. However, when compared with DRAM, high density integration is difficult because of larger cell area.

Recently, a new SRAM structure which employs a negative differential resistance characteristic of the thyristor has been proposed and expected for high integration. See F. Nemati et al, "A Novel Thyristor-based SRAM Cell (T-RAM) for High-speed, Low-Voltage, Giga-scale Memories" IEDM88, pp283–286.

FIG. 19 illustrates an equivalent structure of such memory cell and FIG. 20 shows also an equivalent circuit. This SRAM cell is composed of a thyristor TH with a gate and a transistor TR which is connected in series with the thyristor TH. The thyristor TH has a stacked pnpn structure on a substrate. A gate electrode is provided to surround an n type emitter layer (cathode layer). The transistor TR has a diffused layer which is commonly used as an n type emitter (cathode layer) of the thyristor.

A p type emitter layer (anode layer) is connected to the reference potential Vref and the gate electrode is connected to a word line WL2. A gate electrode of the transistor TR is connected to a separate word line WL1. The other diffused layer of the transistor TR is connected to a bit line BL.

Such structure enables to store, for example, ON state as data "1" and OFF state as data "0" using the negative differential resistance characteristic. Practically, at data writing, a power supply potential Vdd is applied to the word lines WL1 and WL2. And to the bit line BL, Vdd is applied for data "0" and ground potential GND for data "1". The reference potential Vref is selected positive potential less than Vdd. As a result, for data "1", the thyristor TH turns ON and for data "1", the thyristor maintains OFF state. The written data is maintained by applying a predetermined holding voltage which is less than Vdd to the word line WL1.

Since the SRAM cell described above has only two elements which is less than ordinary SRAM cell, a unit area of $8F^2$ where F is the minimum process dimension can be realized.

However, as shown in FIG. 19, it is not easy to realize the unit area of $8F^2$ because there exist the following problems; Firstly, since the thyristor TH has three-dimensional structure and the transistor TR has ordinary planar structure, it is difficult to form both gate electrodes at the same time, secondary, since thyristor has vertical structure, impurity doping is difficult, thirdly, there exist large steps (level differences) on the substrate; and fourthly, it its necessary to provide a lot of interconnections, i.e. two word lines, one bit line and reference potential line in the upper part of the device in order to obtain the product device.

SUMMARY OF THE INVENTION

According to one embodiment of the semiconductor device according to the present invention, there is provided a semiconductor device comprising:

a substrate having a semiconductor substrate and a semiconductor layer provided on the semiconductor substrate, said semiconductor layer being insulated by an insulating film;

a thyristor with a gate, its pnpn structure being laterally formed in said semiconductor layer of said substrate; and a transistor formed in said semiconductor layer of said substrate; said transistor being connected to one terminal of said thyristor.

According to one embodiment of the method for manufacturing the semiconductor device according to the present invention, there is provided a method for manufacturing a semiconductor device having memory cells each having a thyristor with gate and a transistor connected in series with the thyristor, comprising;

defining an element forming region isolated by an element isolation insulation film in a semiconductor layer provided on a semiconductor substrate, said semiconductor layer being insulated by an insulation film provided on the semiconductor substrate;

forming a second base region of a first conductivity type in said element forming region;

forming a first gate electrode of the thyristor and a second gate of the transistor above said second base region, said first and second gate electrodes being disposed in parallel;

implanting ions to form a source and drain diffused regions of the second conductivity at both sides of said second gate electrode, and to form, at the same time, a second emitter region of the second conductivity type and a first base region, one of said source and drain diffused regions and said second emitter region being common region;

providing a hole penetrating said first base region and said insulating film under said base region; and filling said hole with material of the first conductivity type to obtain a plug member as a first emitter region which contacts said semiconductor substrate.

BRIEF DESCRIPTION OF THE DRAWINGS

In the accompanying drawings;

FIG. 3A is an equivalent structure diagram of two SRAM cells of the SRAM cell array;

FIG. 3B is an equivalent circuit diagram of FIG. 3A;

Figure 15:
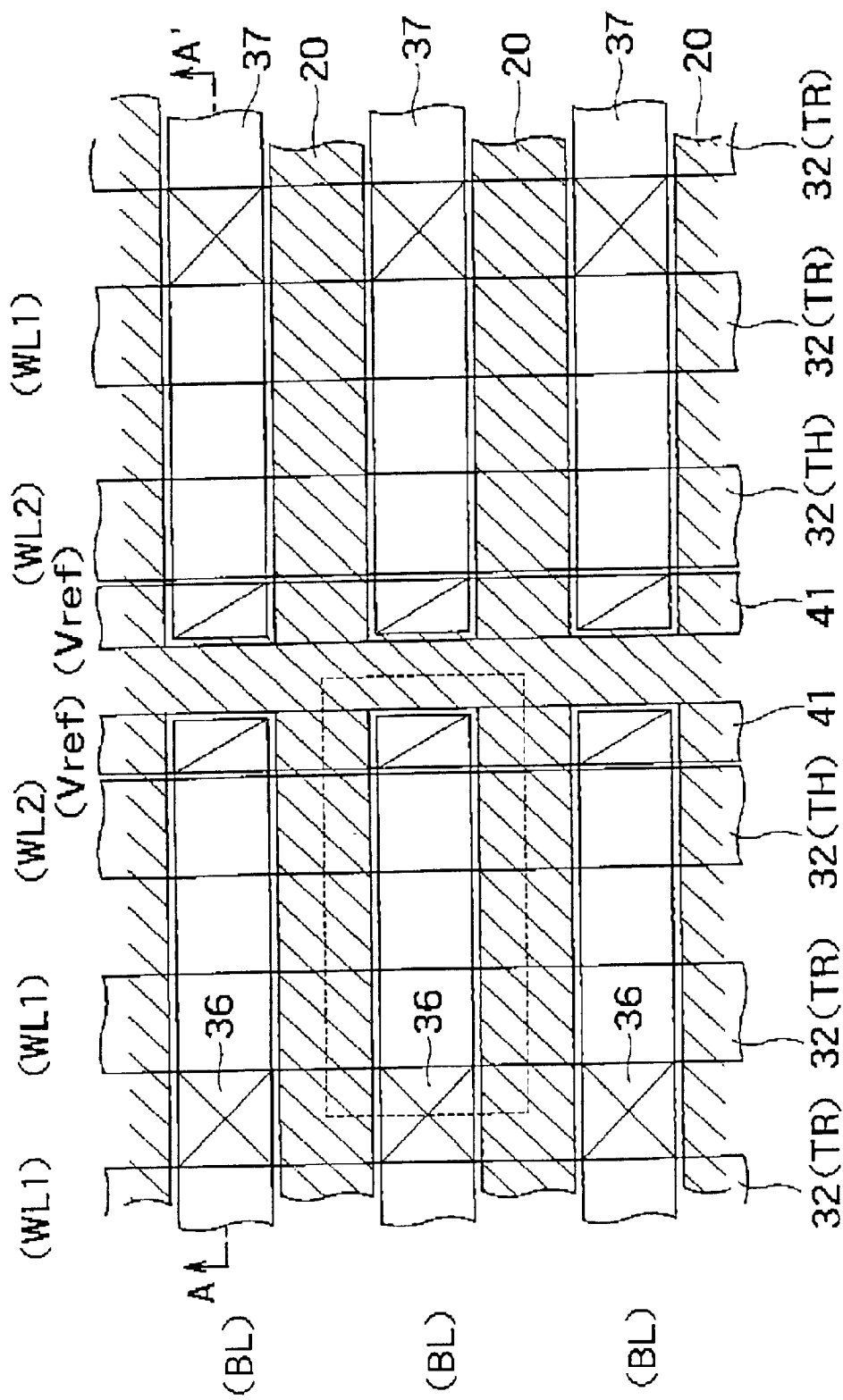
FIG. 15 is a plan view of the SRAM cell array according to further embodiment of the present invention.
Figure 17:
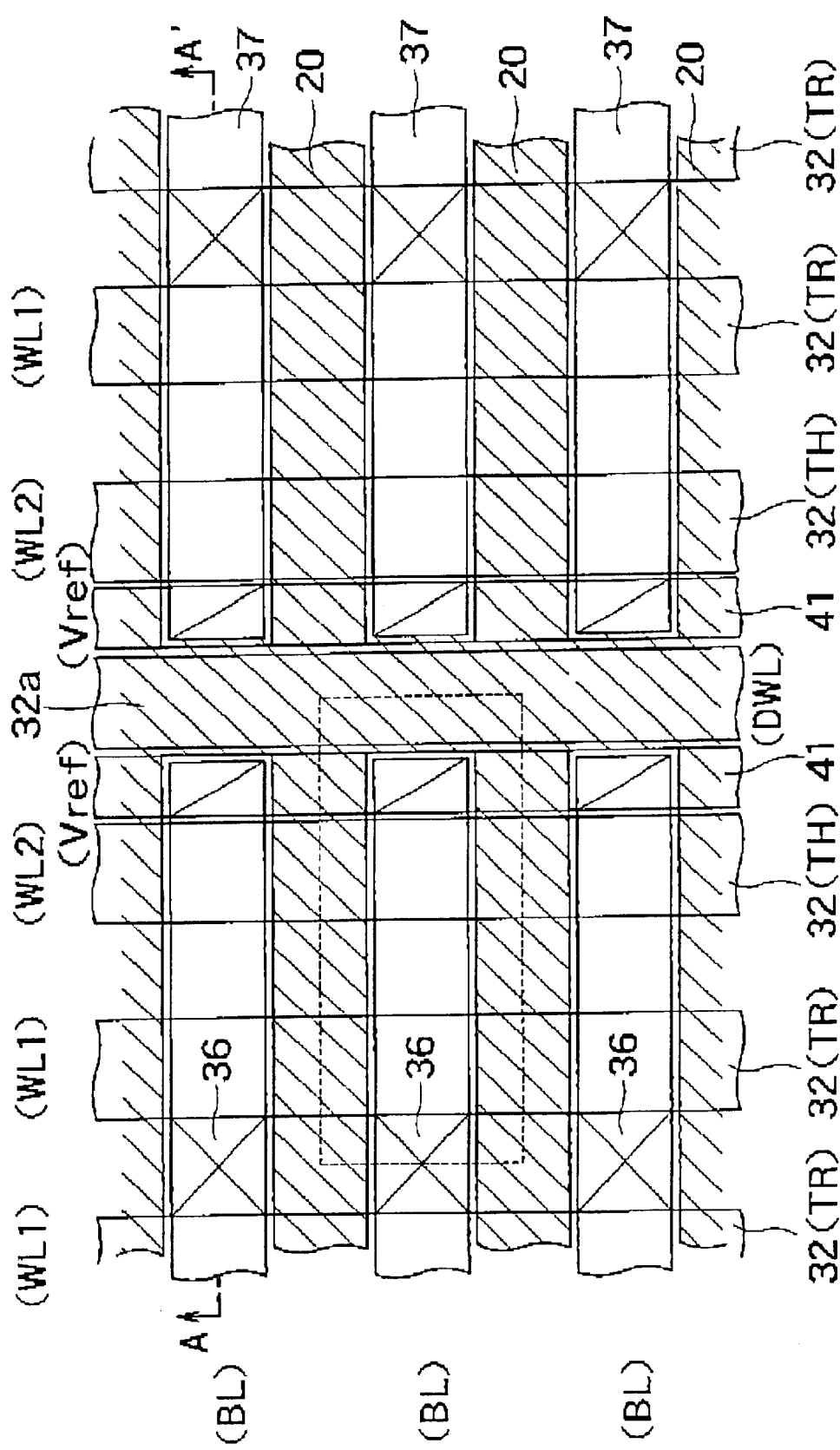
Figure 18:
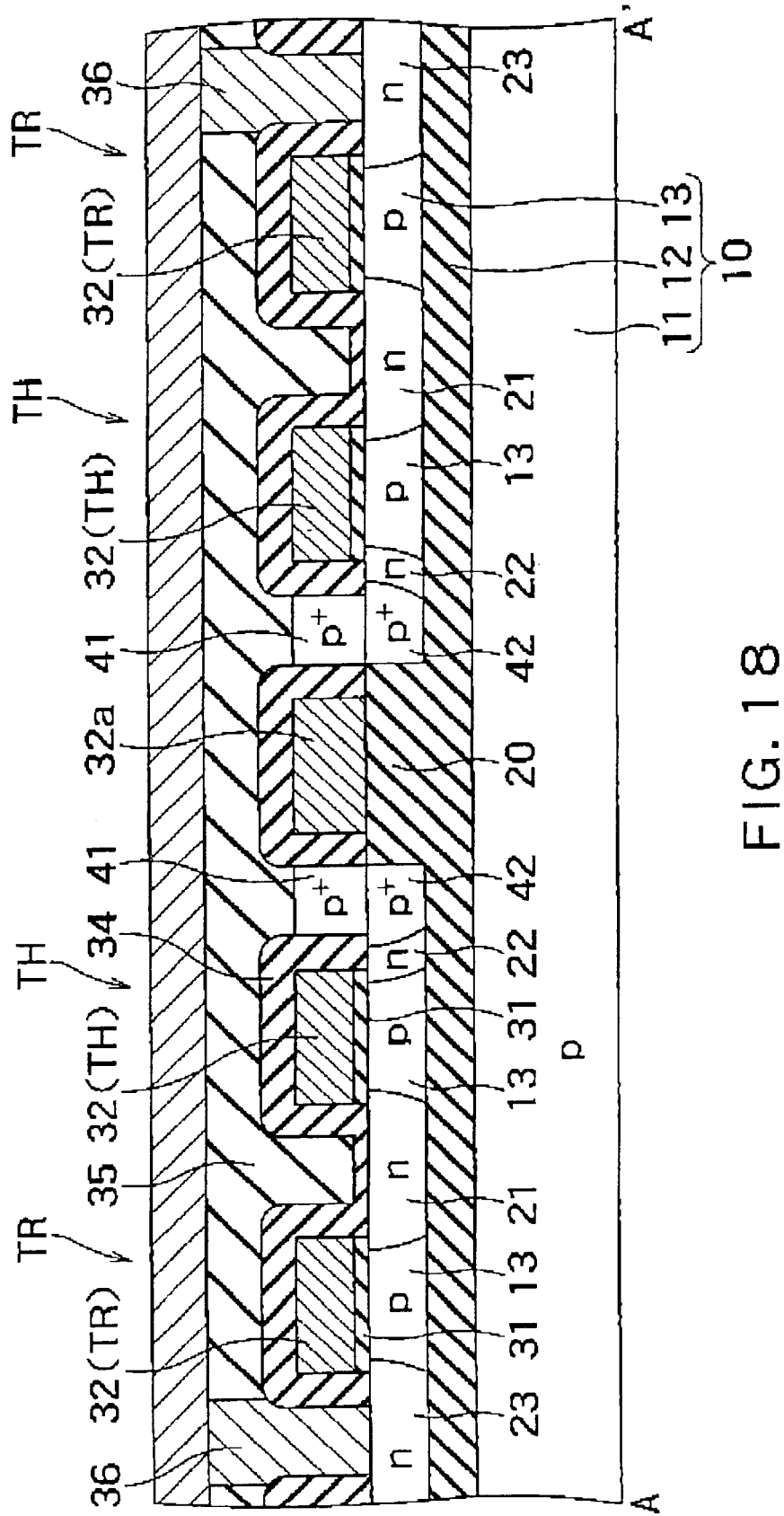
Figure 19:
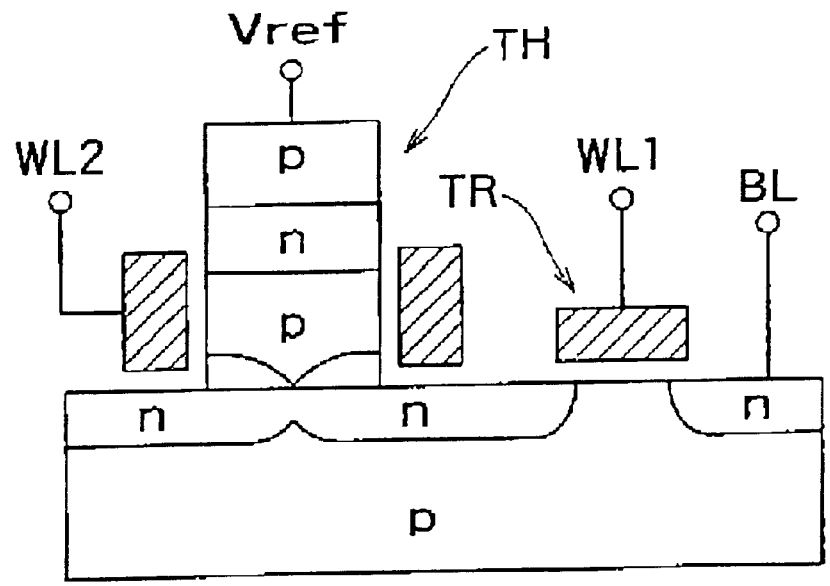
Figure 20:
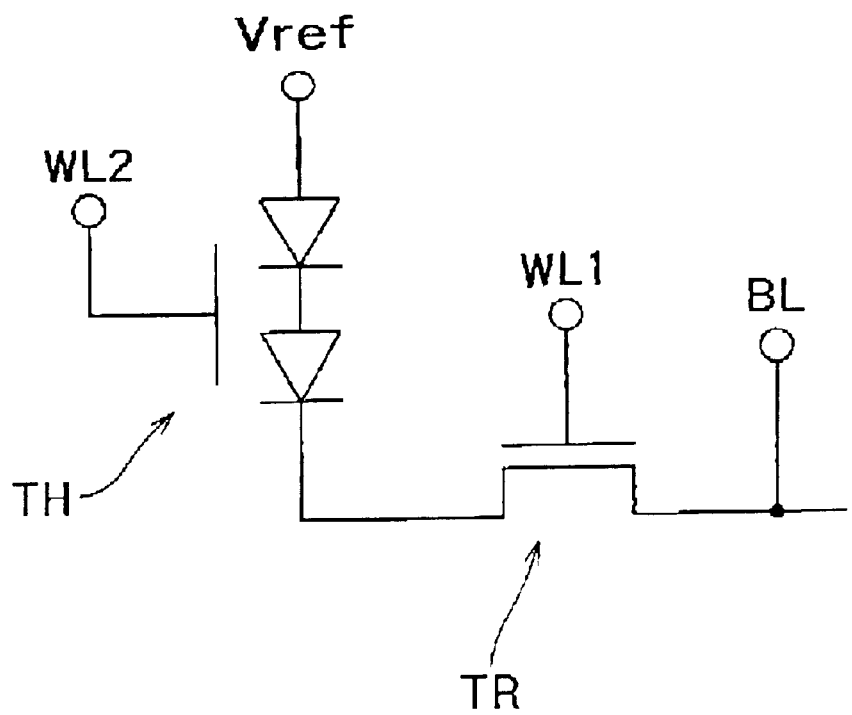

FIG; 16 is a cross sectional view along the line A–A' of the FIG. 15;

FIG. 17 is a plan view of the SRAM cell array according to still further embodiment of the present invention;

FIG. 18 is a cross sectional view along the line A–A' of the FIG. 17;

FIG. 19 is a schematic view illustrating structure of a SRAM cell which uses negative differential resistance according to the prior art; and FIG. 20 is an equivalent circuit diagram of the SRAM cell shown in FIG. 19.

DETAILED DESCRIPTION OF THE INVENTION

Figure 1:
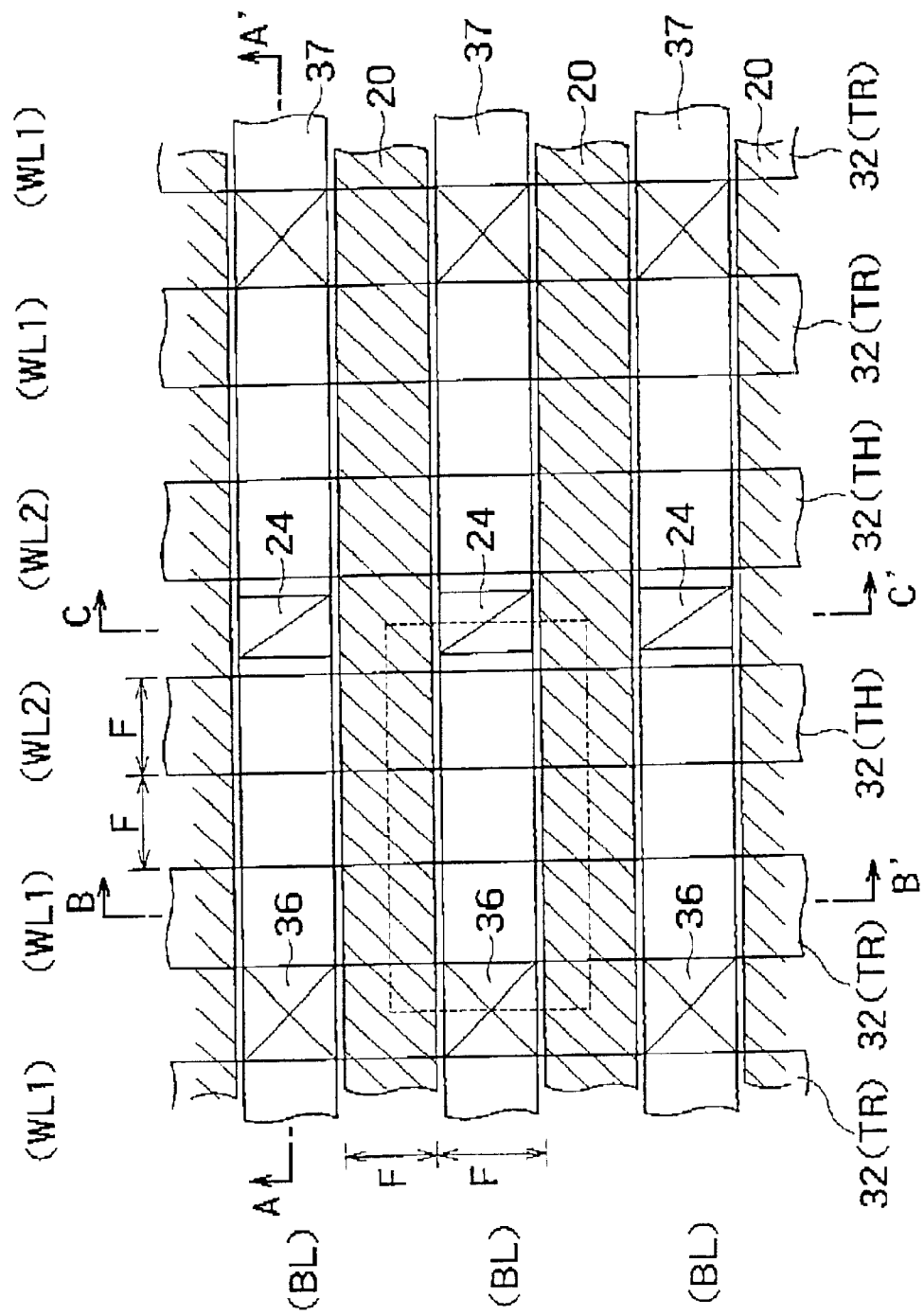
FIG. 1 is a plan view of the SRAM cell array according to one embodiment of the present invention.
Figure 2A:
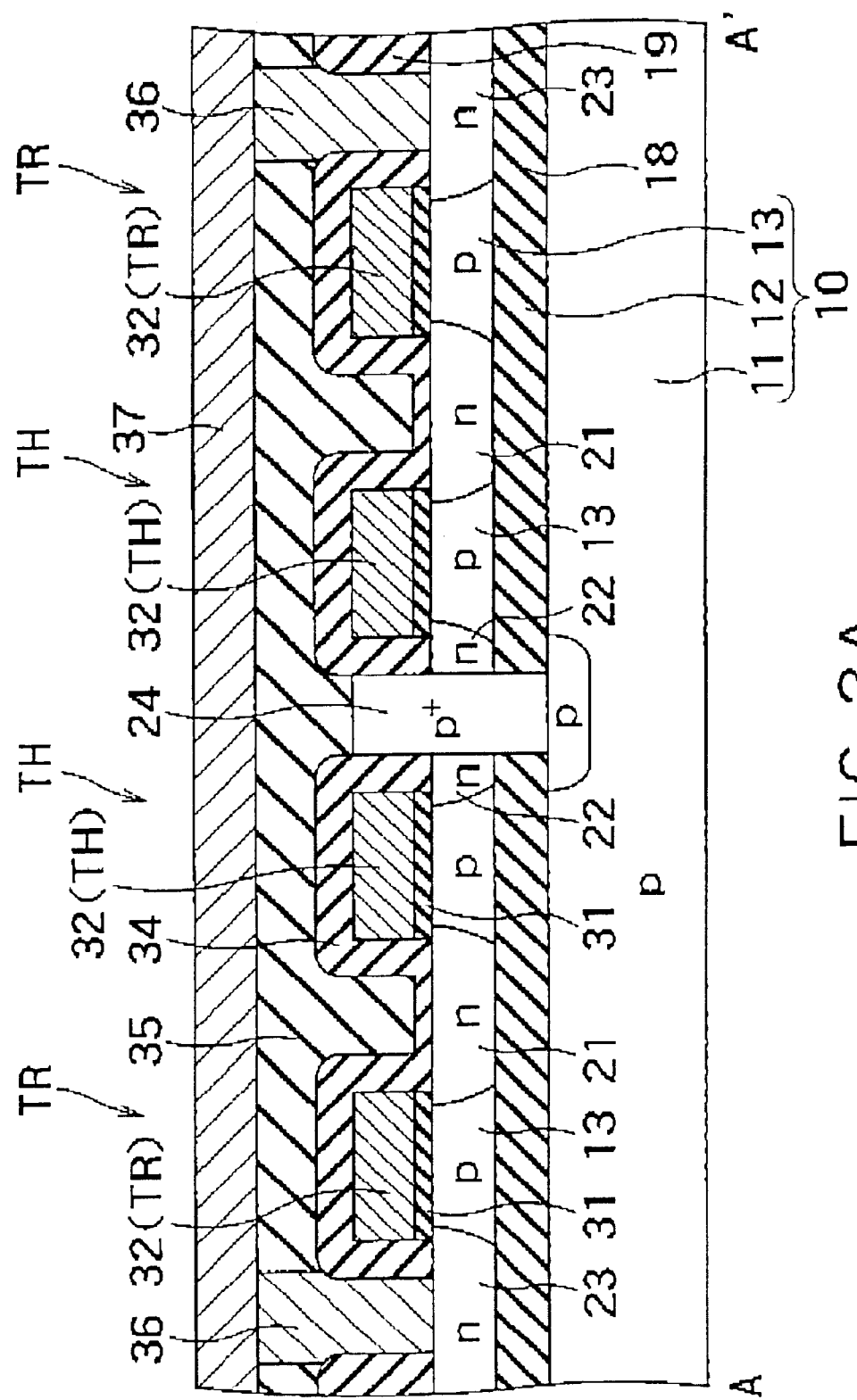
FIG. 2A is a cross sectional view along the line A–A' of the FIG. 1.
Figure 2B:
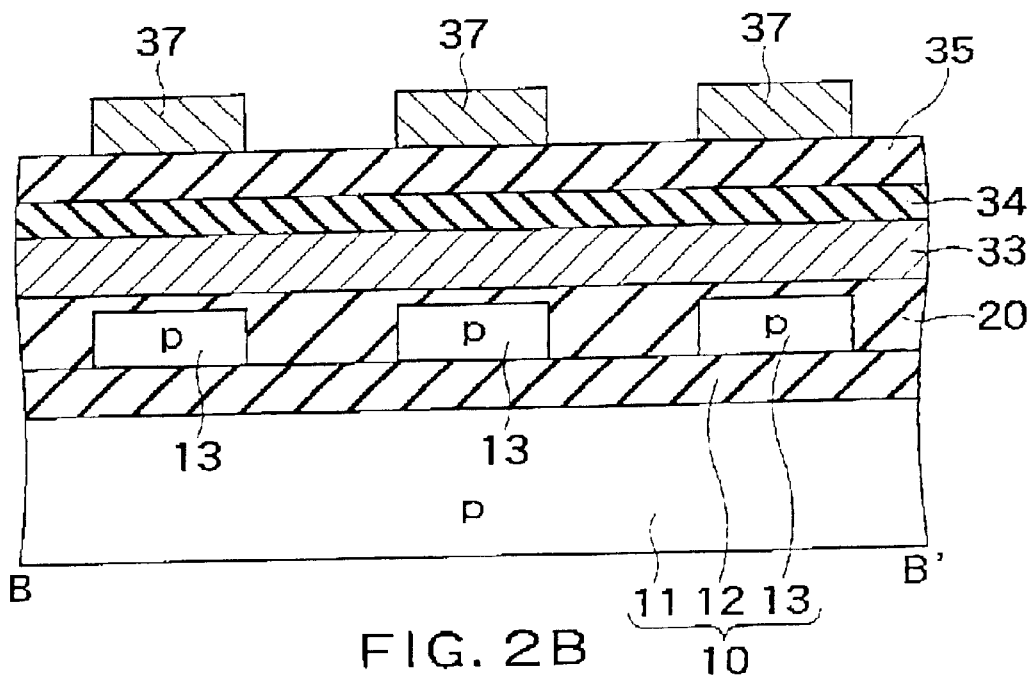
FIG. 2B is a cross sectional view along the line B–B' of the FIG. 1.
Figure 2C:
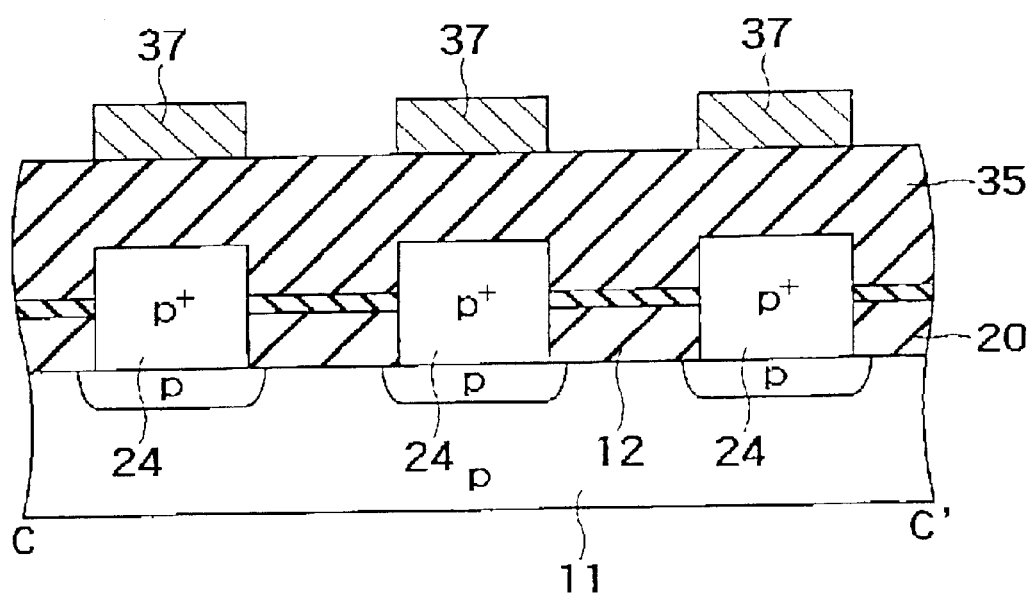
FIG. 2C is a cross sectional view along the line C–C' of the FIG. 1.

FIG. 1 is a plan view of the SRAM cell array according to one embodiment of the present invention and FIGS. 2A, 2B and 2C respectively show cross sectional views along the line A–A', B–B' and C–C' of the FIG. 1. FIG. 3A is an equivalent structure diagram of neighboring two SRAM cells and FIG. 3B shows an equivalent circuit thereof.

The SRAM cell array is formed in an SOI substrate 10 which has a silicon layer 13 insulated by a silicon oxide (BOX) film 12 formed on a silicon substrate 11. The silicon substrate 11 and the silicon layer 13 are of p type doped with boron. The silicon layer 13 of the SOI substrate 10 is divided into stripe shaped element forming regions isolated by element isolation insulating film 20 as STI (Shallow Trench Isolation). In each of the element forming region, memory cells each having a thyristor TH with a gate and a transistor TR are arranged symmetrically with a bit line contact 36 located in the center.

Gate electrodes 32 (TH) for the thyristors TH and gate electrodes (32TR) for the transistors TR are formed above the p type doped silicon layer 13 via a gate insulating film 31. These gate electrodes 32 (TH) and 32 (TR) are continuously patterned so that they cross a plurality of stripe shaped element forming regions and are used as word lines WL1 and WL2 which run in parallel.

N type diffused regions 21, 22 and 23 are formed in a manner of self alignment with the gate electrodes 32. The n type diffused regions 21 and 22 are the source and drain diffused regions of the transistor TR. The n type diffused region 21 is also an n type emitter (cathod) region of the thyristor TH and the n type diffused region 22 is also an n type base region. Furthermore, a plug 24 made of $p^+$ type polycrystalline silicon filled in a hole which is formed to penetrate the n ype diffused region 22 as the n type base region, is used as p type emitter (anode) of the thyristor. In other words, the thyristor TH is made to have a lateral pnpn structure and the silicon layer 13 below the gate electrode 32 (TH) is used as p type base.

The plug 24 is a common anode terminal for thyristors TH of two neighboring cells. This plug 24 is filled in a hole which penetrates the silicon layer 13 and a oxide film 12 below the silicon layer 13 and is contacted to the silicon substrate 11. Therefore, the silicon substrate 11 is used as the reference potential terminal Vref as shown in FIG. 3.

The surface on which the transistors TR and the thyristors TH are formed is covered by interlayer insulation film 25, and the word lines WL1, WL2 and the bit line (BL) 37 which crosses over the word lines WL1 and WL2, are disposed on the interlayer insulation film 25. This bit line 37 is connected to the n type diffused region 23 of the transistor TR via a bit line contact 36 which is filled in the interlayer insulating film 35.

Thus, SRAM cells each having a lateral thyristor TH and a transistor TR are realized using the SOI substrate.

In FIG. 1, a unit cell region is designated by a dashed line. Supposing a design rule (minimum process dimension) to be F, if word lines WL1 and WL2 are formed according to a relation (line/space)=F/F and similarly if a bit line is formed according to the same relation (line/space)=F/F, the unit cell area will be $8F^2$.

Figure 4A:
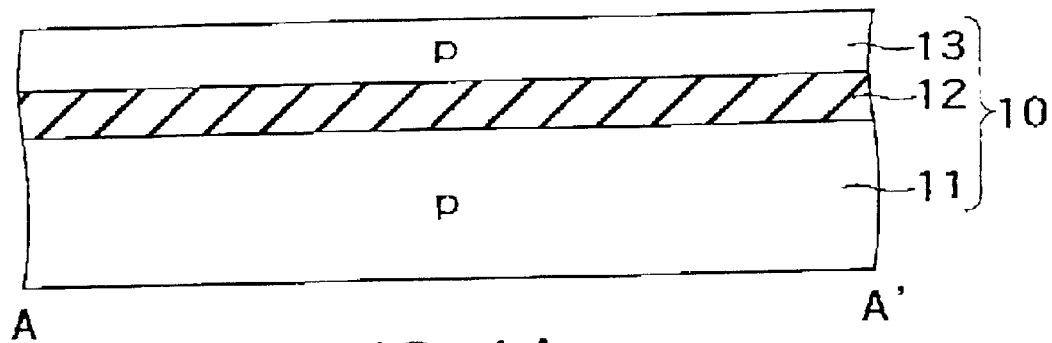
FIGS. 4A, 4B and 4C are sectional views showing formation of device isolations in the process of the SRAM cell array.
Figure 4B:
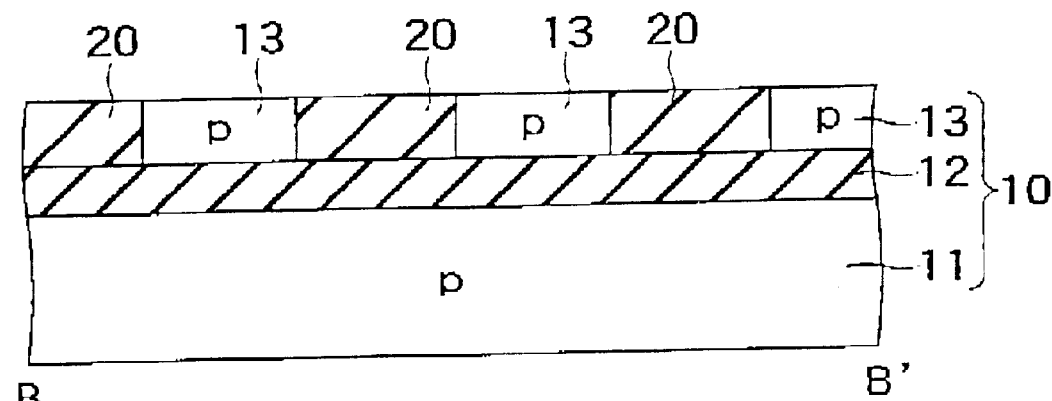
Figure 4C:
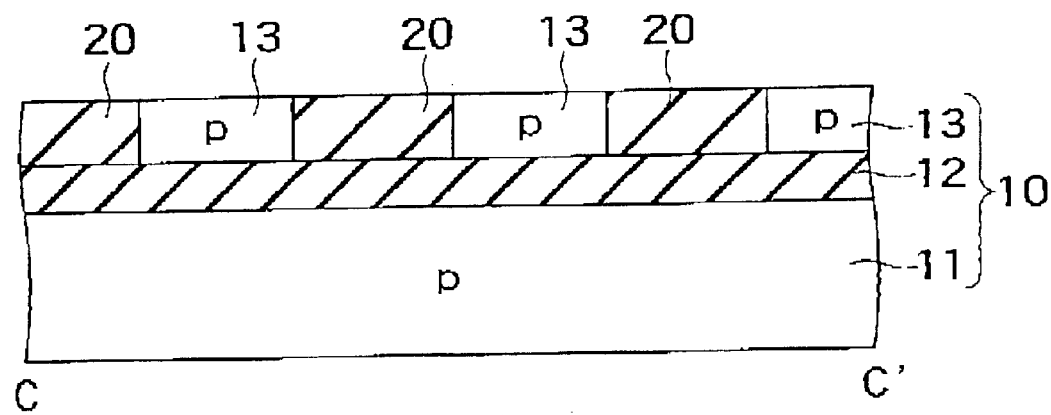

Now, a process for manufacturing the SAM cell will be explained referring to FIGS. 4A–4C through 8A–8C. The reference letters A, B and C of the drawing numbers correspond to the cross sectional views of FIGS. 2A, 2B and 2C, respectively. First, as shown in FIGS. 4A, 4B and 4C, boron is doped into the silicon substrate 11 and the silicon layer 13 to obtain p type layers. Next, the silicon layer 13 is selectively etched to obtain element isolation trenchs and element isolation insulation film 20 is filled in the trenchs. Thus the silicon layer 13 is defined as a plurality of stripe-shaped element forming regions each being isolated.

Figure 5A:
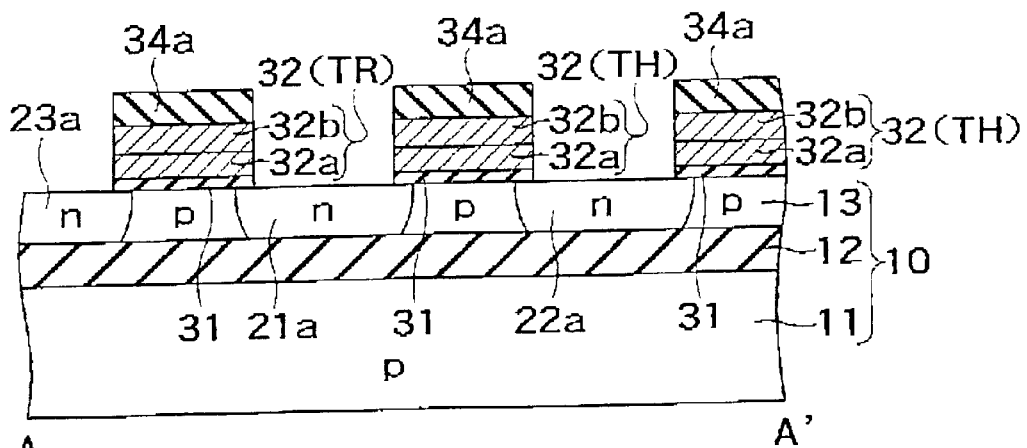
FIGS. 5A, 5B and 5C are sectional views showing formation of gate electrodes and n type diffusion regions in the process of the SRAM cell array.
Figure 5B:
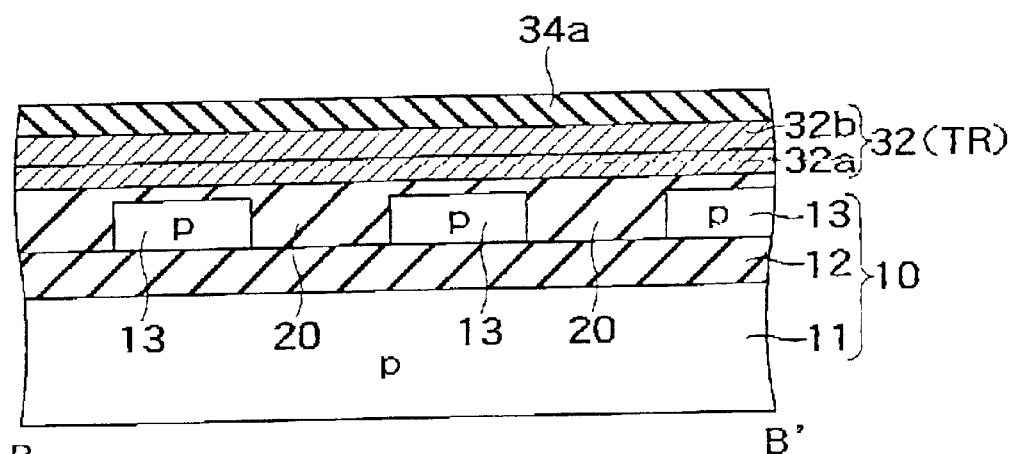
Figure 5C:
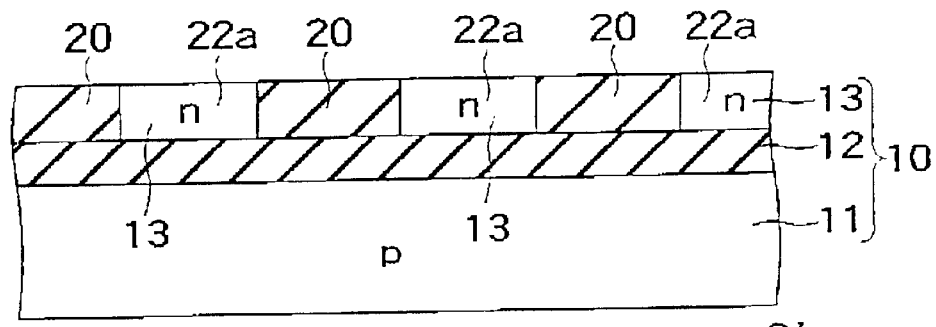

Next, as shown in FIGS. 5A, 5B and 5C, a gate insulating film 31 is formed on the silicon layer 13 and gate electrodes 32 are formed on the gate insulating film 31 to have predetermined pattern. Practically, the gate electrode 32 and word lines WL1, WL2 are obtained by stacking a polycrystalline silicon film 32a and tungsten silicide (Wsi) film and further silicon nitride film 34a, then patterning using photolithography and reactive ion etching (RIE). Furthermore, n type diffused regions 21a, 22a and 23a having depth reaching the silicon oxide film 12 are formed by implanting arsenic ions using the gate electrode 32 as implantation mask. These n type diffused regions 21a, 22a and 23a are relatively low concentration regions of the n type diffused regions 21, 22 and 23 shown in FIG. 2A.

Figure 6A:
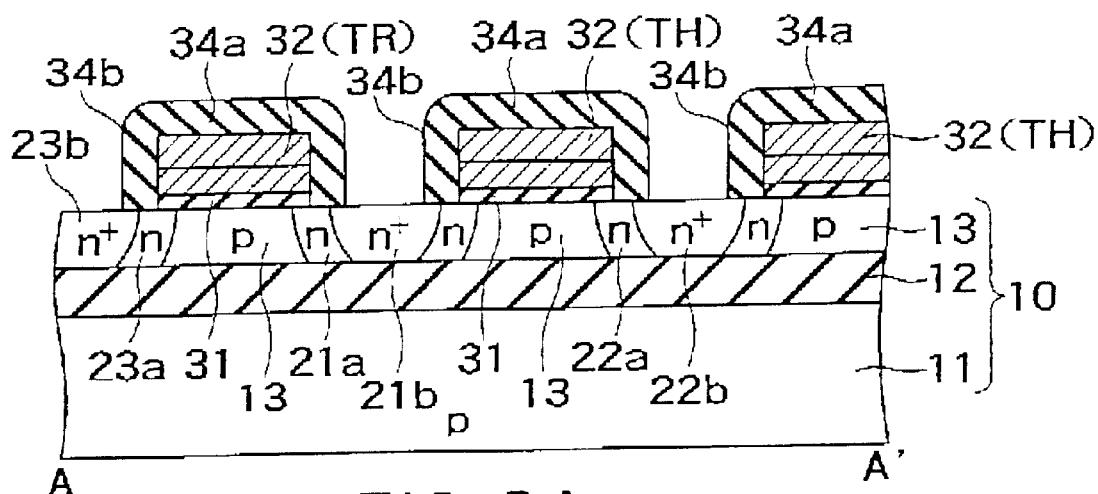
FIGS. 6A, 6B and 6C are sectional views showing formation of side wall insulating films and $n^+$ type diffusion regions in the process of the SRAM cell array.
Figure 6B:
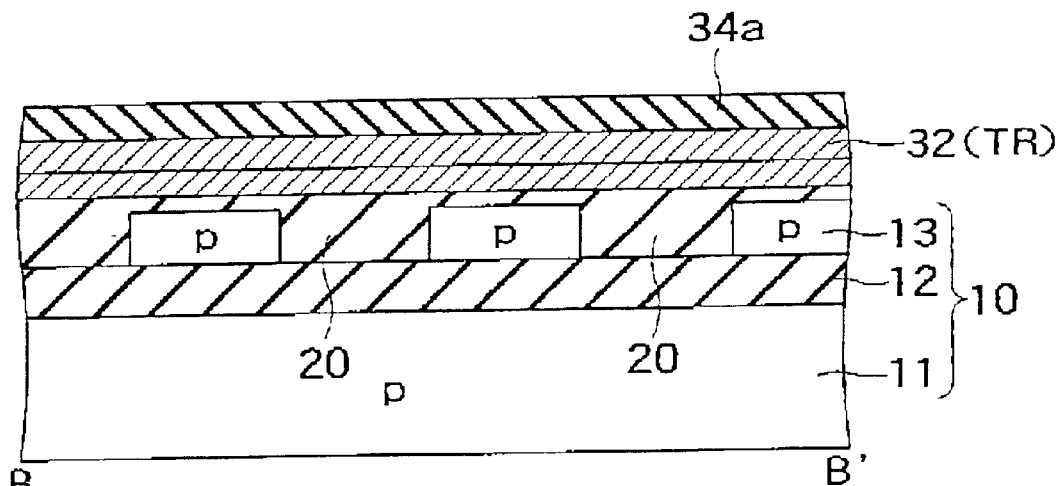
Figure 6C:
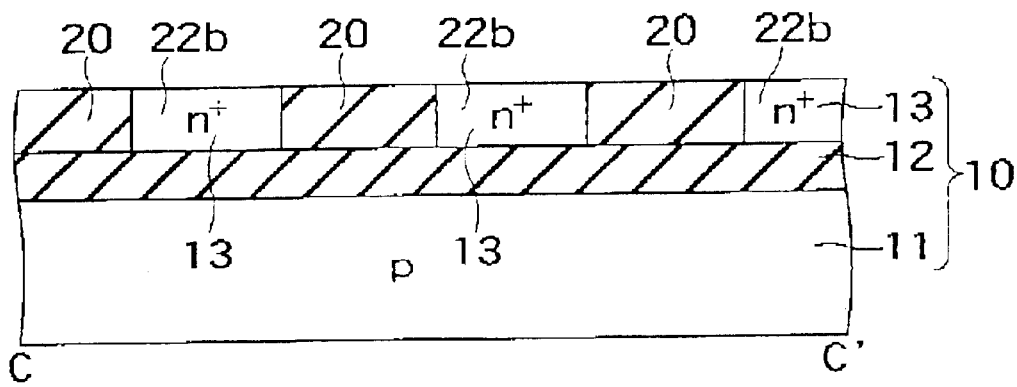

Next, as shown in FIGS. 6A, 6B and 6C, a silicon nitride film 34a is deposited then etched back to obtain side wall insulating film 34b at sides of the gate electrodes 32. Then phosphorous ions are implanted using the side wall insulating films 34b as ion implanting masks to obtain n⁻ diffused regions 21b, 22b and 23b in the n type diffused regions 21a, 22a and 23a, respectively.

Figure 7A:
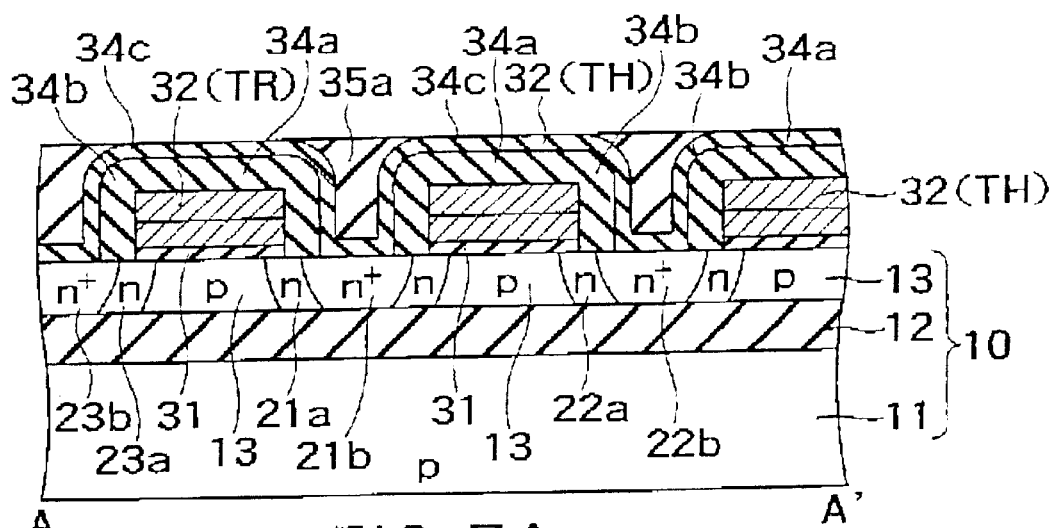
FIGS. 7A, 7B and 7C are sectional views showing flattening in the process of the SRAM cell array.
Figure 7B:
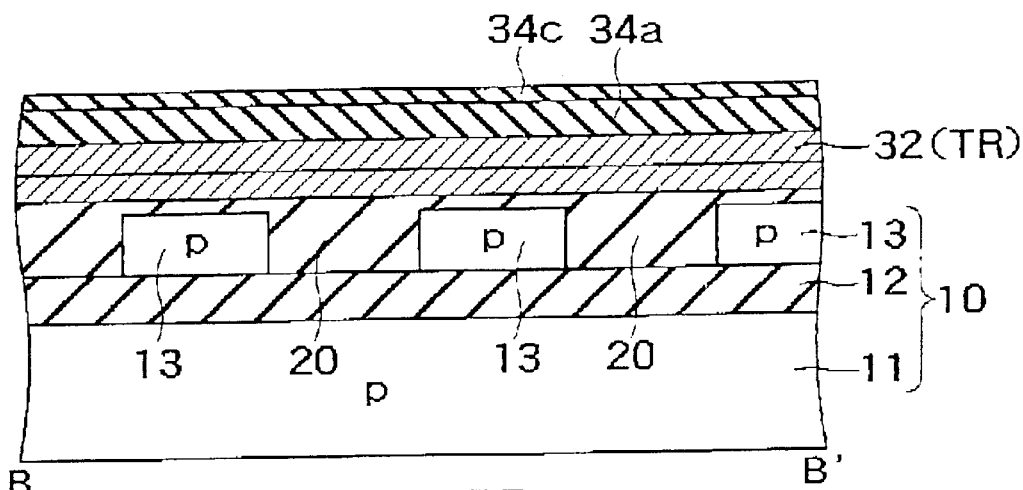
Figure 7C:
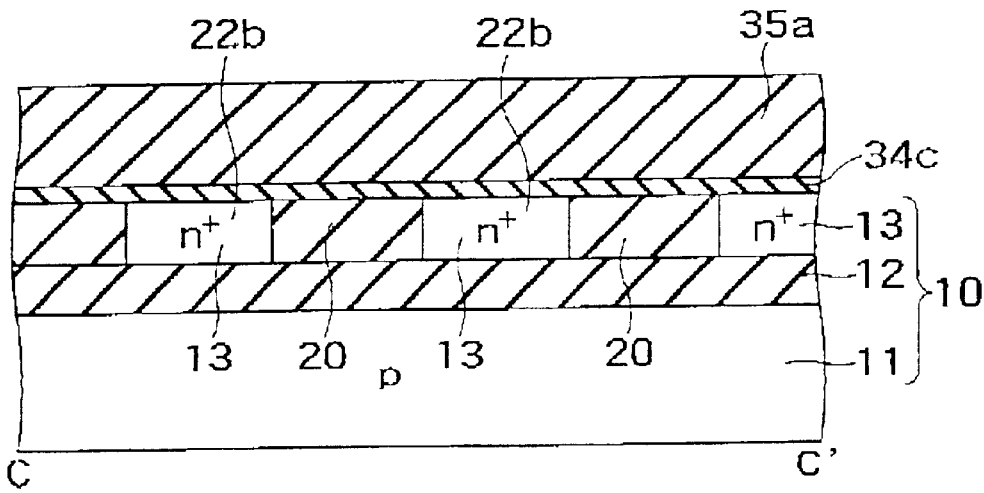

Next as shown in FIGS. 7A, 7B and 7C, a thin silicon nitride film having a thickness of 50 nm is deposited on the whole surface, then a silicon oxide film using TEOS (TEOS oxide film) is deposited to bury the word lines WL1 and WL2. The TEOS oxide film will be a part of the interlayer insulating film 35 and is flattened to fill the space between word lines WL1 and WL2 using CMP (Chemical-Mechanical Polishing) process.

Figure 8A:
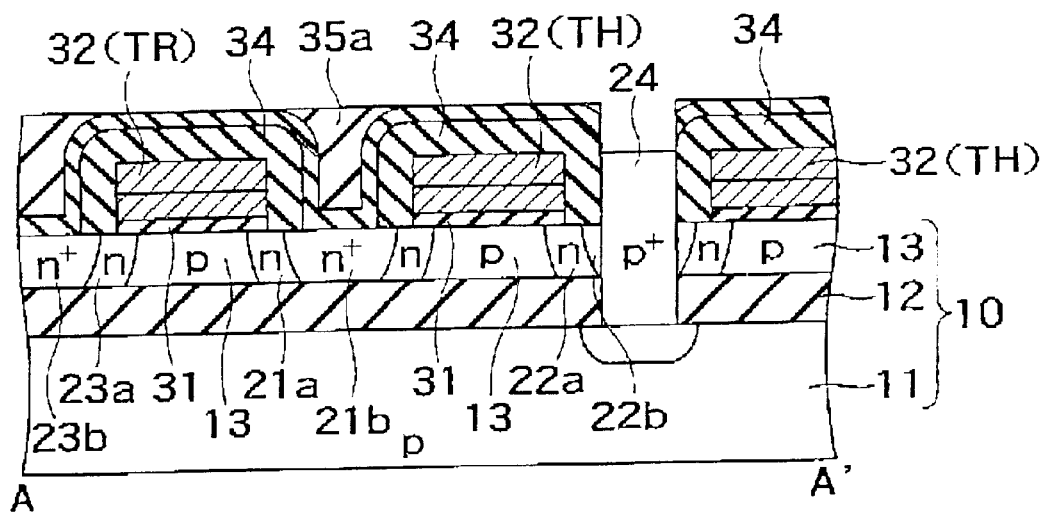
FIGS. 8A, 8B and 8C are sectional views showing filling a plug in the process of the SRAM cell array.
Figure 8B:
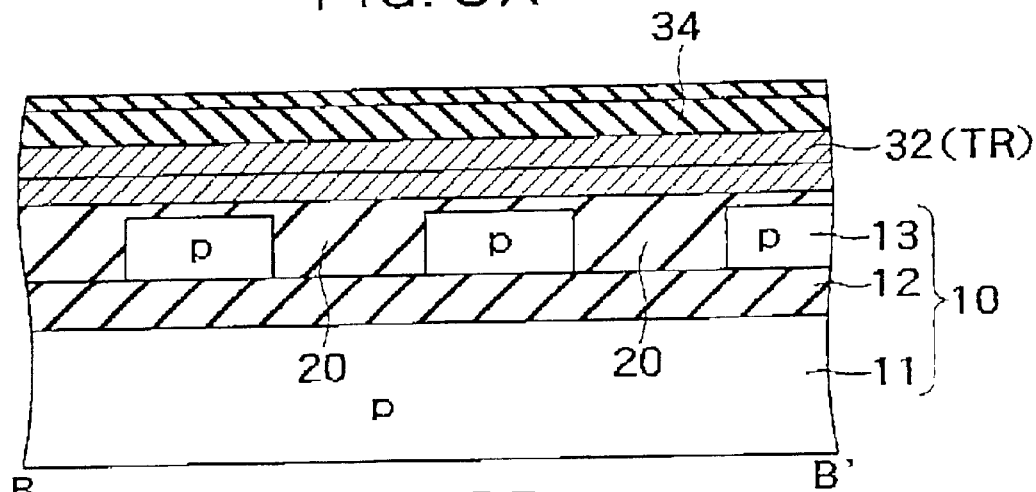
Figure 8C:
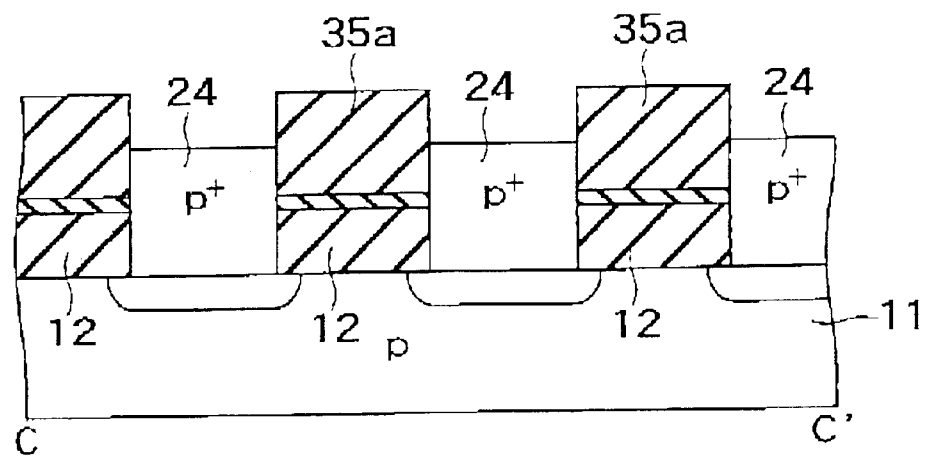

Next, as shown in FIGS. 8A, 8B and 8C, a plug 24 is filled in a location of the common anode for two thyristors of neighboring cells, in other words, between neighboring word lines WL2 which are also gate electrodes 32 (TH) of the thyristors TH. Practically, this process starts by digging a contact hole which reach the silicon substrate 11 using photolithography and RIE. Care should be taken so that the thickness of the silicon nitride film 34 would not be excessively decreased because the RIE affect the multilayer of the TEOS oxide film 25a, silicon nitride film 34c, the silicon layer 13, the silicon oxide film 12. Accordingly, conditions for gas are appropriately changed in order that the thickness of the silicon nitride film 34 covering the gate electrode 32 would not be decreased excessively. Furthermore, by this RIE, most part of the n+ type diffused region 22b doped with phosphorous 1s removed. Then, p+ type polycrystalline silicon is deposited and etched back to fill the contact hole with the plug 24. The top surface of the plug 24 is positioned to the half of a step of the gate electrode 32.

Through the above-mentioned process, the lateral thyristor TH having plugs 24 as p type emitters. Furthermore, the silicon substrate 11 to which the plugs 24 are connected is used as a supply terminal for the reference voltage Vref. In the course of heat treatment followed, n+ type diffused regions 21b, 22b and 23b where phosphorous ions are implanted and n type diffused regions 21a, 22a and 23a where arsenic ions are implanted will be united and become n type diffused regions 21, 22 and 23. The reason of such phenomenon is that the diffusion speed of phosphorous is higher than that of arsenic.

Then, as shown in FIGS. 2A, 2B and 2C, an interlayer insulating film 35 of TEOS oxide film is deposited and flattened by CMP process. Furthermore, contact holes are formed by lithography and RIE. The contact holes are provided at the positions where common diffused regions of transistors TR of neighboring cells exist, and are formed in self-aligned manner with the gate electrode 32 (TR). N+ type polycrystalline silicon is filled in the contact hole to obtain bit line contact plugs 36. Then, a barrier metal and aluminum are deposited and patterned by RIE to obtain bit lines 37.

By employing the above-mentioned process, an SRAM cell array having the lateral thyristors is obtained. The process according to this embodiment is almost the same as that for forming ordinary transistor except for the step to provide contact holes which penetrates the oxide film of the SOI substrate. Therefore, there is only slight mismatching of process between the process for SRAM cells and the process for peripheral logic circuits, and as a result, the SRAM cells according to this embodiment will be effective for memory devices having logic circuits on the same substrate. Furthermore, since the thyristor has similar planar structure as the transistor, a unit area of $8F^2$ can be easily realized.

Still further, since the silicon substrate of the SOI substrate is used as reference potential Vref terminal, loss of area usually caused by providing a lot of interconnections at the upper surface is avoided. If p type impurity is doped in the silicon substrate, the substrate will be used as the reference potential terminal line having low resistance.

Figures 9, 10:
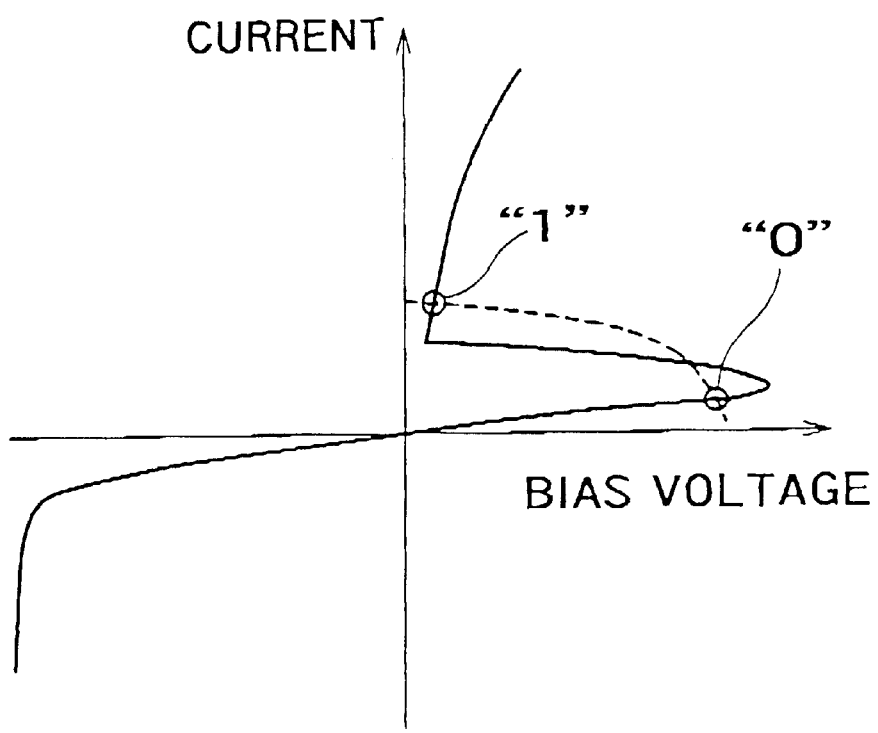
FIG. 9 is a table showing various operation modes of the SRAM device.
FIG. 10 is a graph showing bias voltage vs current characteristic at data holding.

Various operation modes of the SRAM cell according to this embodiment of the present invention are shown in FIG. 9. "Hold" state is obtained by effecting the word line WL2 which is the gate of the thyristor TH to ground potential GND, and by applying predetermined holding potential VL which is lower than the power supply voltage Vdd to the word line WL1 which is also the gate of the transistor TR. Under such a condition, as shown in FIG. 10, the sell holds data "0" (the thyristor is OFF state) and data "1" (the thyristor is ON state).

Figure 11:
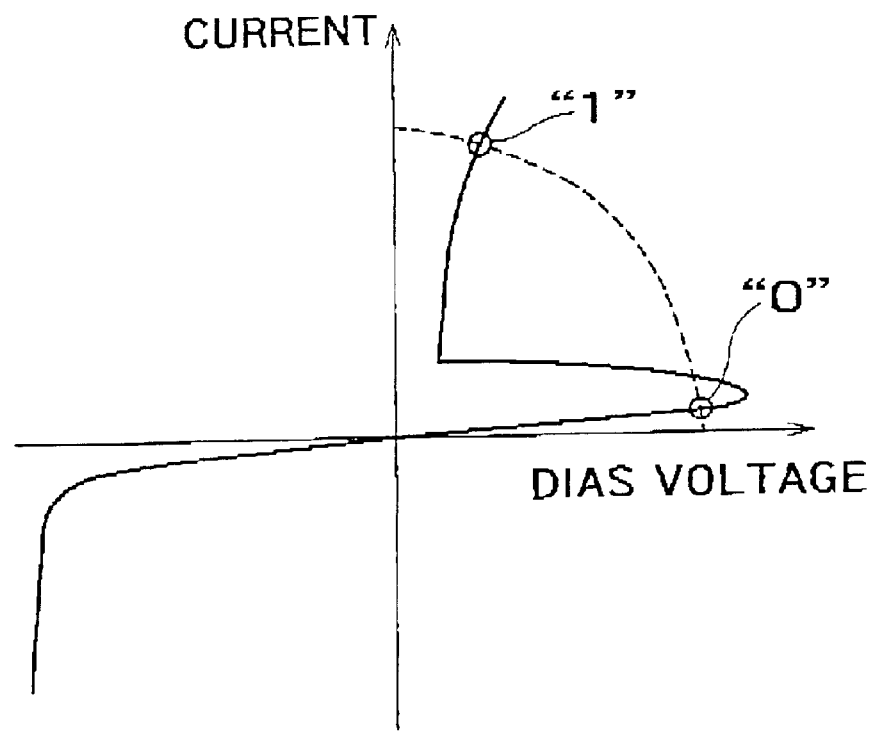
FIG. 11 is a graph showing bias voltage vs current characteristic at data reading.
Figure 12:
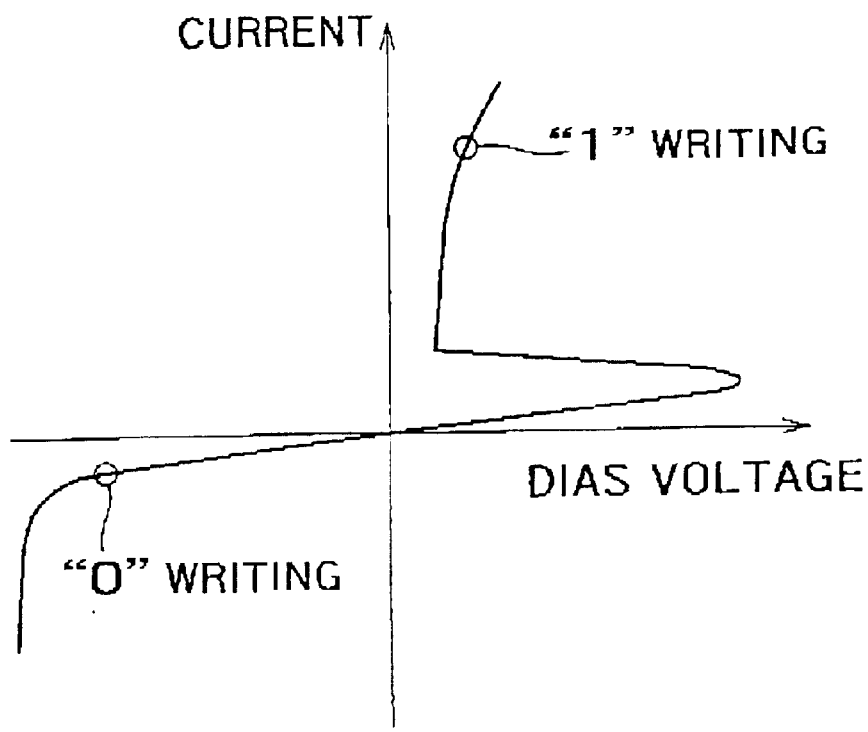
FIG. 12 is a graph showing bias voltage vs current characteristic at data writing.

At data reading, Vdd is applied to the selected word line WL1 to turn on the transistor TR. As a result, as shown in FIG. 11, in the cage of data "1", cell current will flow but in the case of data "0", no cell current will be detected, and data is determined by these difference in current.

At data writing, Vdd is applied to the selected word lines WL1 and WL2 and for data"0" writing, Vdd is applied to the bit line BL to write data "0" and the ground potential GND is applied to the bit line BL to write data "1". Under these condition, at data "1" writing, the thyristor TH will turn on and at data "0" writing, the thyristor TH will maintain OFF state. When the thyristor is returned to Hold state, the states shown in FIG. 10 is obtained.

Figure 13:
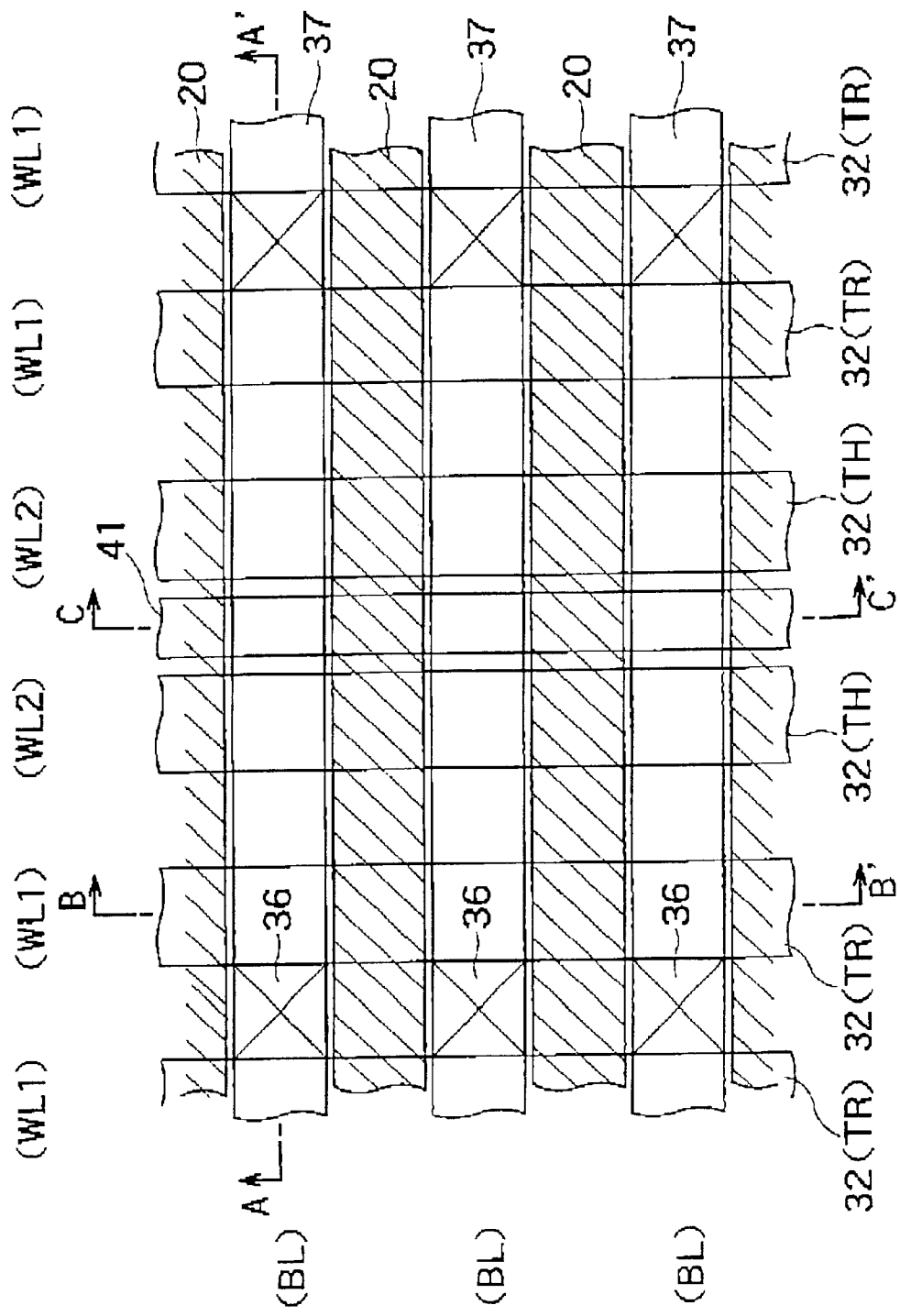
FIG. 13 is a plan view of the SRAM cell array according to another embodiment of the present invention.
Figure 14A:
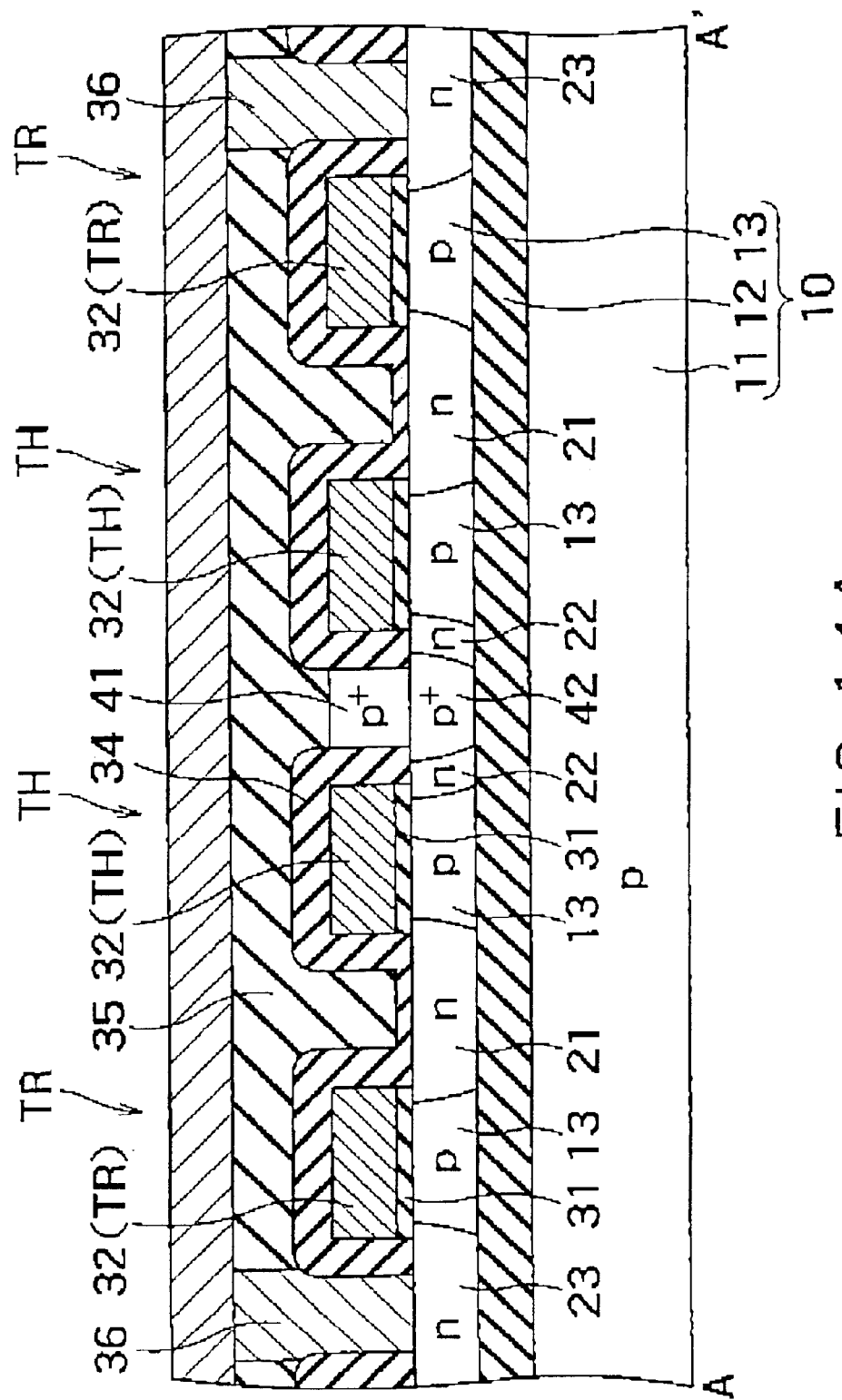
FIG. 14A is a cross sectional view along the line A–A' of the FIG. 13.
Figure 14B:
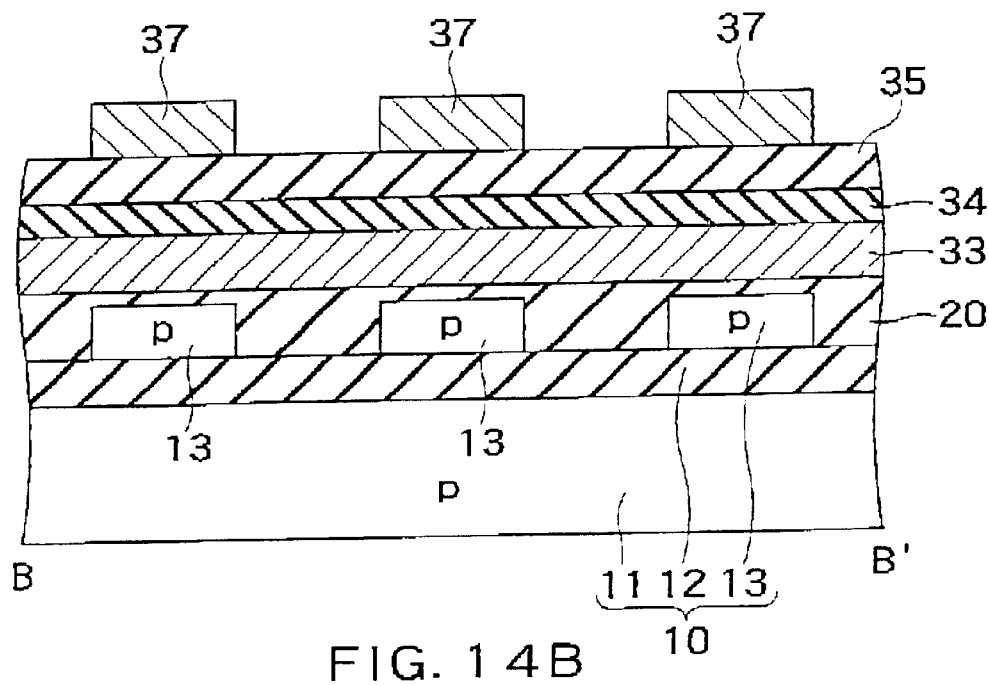
FIG. 14B is a cross sectional view along the line B–B' of the FIG. 13.
Figure 14C:
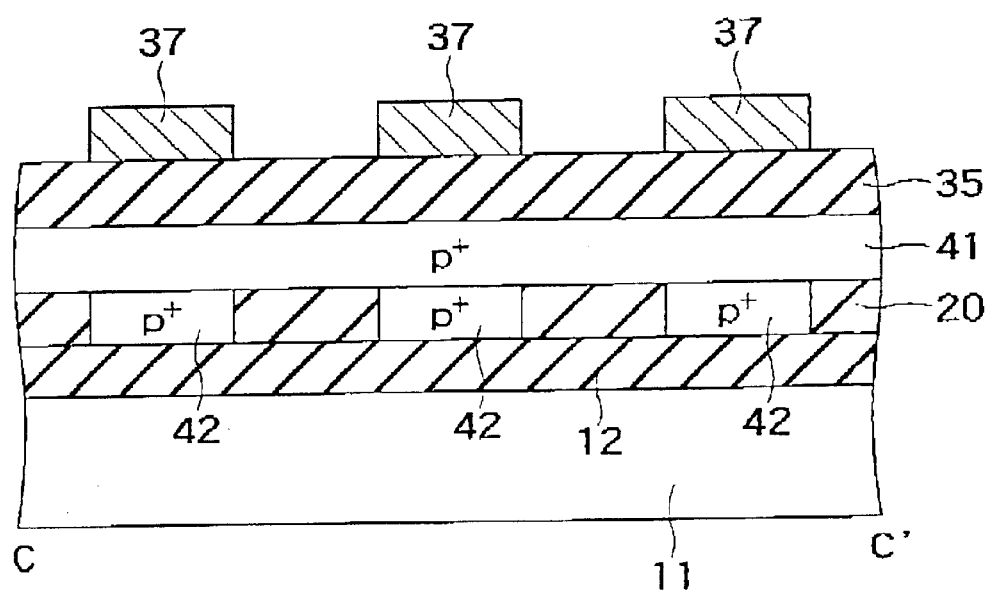
FIG. 14C is a cross sectional view along the lire C–C' of the FIG. 13;.

FIG. 13 shows a layout of another embodiment of the SRAM cell array according to the present invention. FIGS. 14A, 14B and 14C respectively show cross sectional views along the lines A–A', B–B' and C–C'. In these figures, since fundamental cell array structure is substantially the same as the prior embodiment, and same reference numerals are used for corresponding parts and their detailed explanation will be omitted.

The differences between this embodiment and the prior embodiment are now explained. In the prior embodiment, the plugs 24 as p⁺ type emitter (anode) of the thyristor TR are filled in the hole provided to penetrate the silicon layer 24 and the oxide film 12 under the silicon layer 24. In contrast, according to this embodiment, as shown in FIGS. 13 and 14A–14C, a reference potential supply line 41 of p⁺ type polycrystalline silicon is continuously provided between two neighboring word lines WL2. This reference potential supply line does not function as the p type emitter of the thyristor TH. More specifically, as shown in FIG. 14A, a common p⁺ type emitter region 42 is provided in the n type diffused region 22 which locates under the region between two neighboring word lines WL2, and the common p⁺ type emitter region 42 reaches the silicon oxide film 12. The reference potential supply line 41 functions as an interconnection to commonly connect a plurality of p⁺ type emitter regions 42 along the direction of the word lines. According to this embodiment, there is no need to provide deep contacts which penetrate the silicon layer 13 and the silicon oxide layer under the silicon layer 13.

Manufacturing process for the cell array according to this embodiment is basically same as that for the former embodiment except for the step shown in FIGS. 8A, 8B and 8C. In this step, contact holes are formed to have stripe pattern in the regions between two neighboring word lines WL2 to have a depth to expose the silicon layer 13. The depth is sufficient depth for filling the reference potential supply line 41. By implanting high concentration boron ions via the contact holes, p+ type emitter regions 42 are formed in the n type diffused regions 22. Then p+ type polycrystalline silicon is deposited and etched back to provide the reference potential supply lines 41 filled in the contact holes to interconnect the p+ type emitter regions 42.

According to this embodiment, the pnpn structure of the thyristor TH is formed only in the monocrystalline silicon layer 13, and the pnpn structure does not include polycrystalline silicon which was necessary in the prior embodiment. In the prior embodiment, if an interface of polycrystalline silicon and monocrystalline silicon is included in a device, the interface can be a source of leakage when the interface is included in depletion layer. But according to the present embodiment, there is no possibility of forming the source of leakage.

Figure 16:
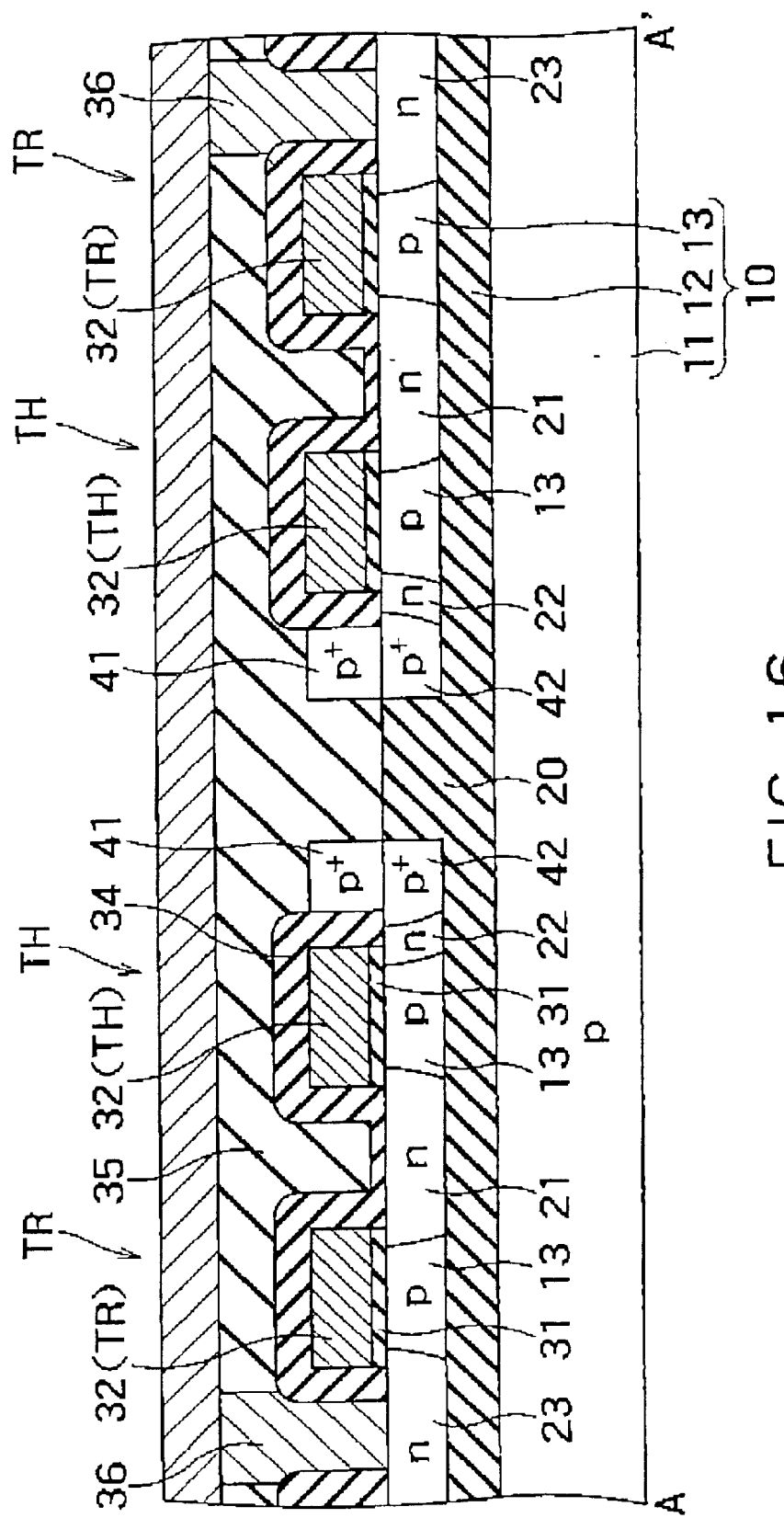

FIG. 15 shows a layout of a cell array according to further embodiment, and FIG. 16 shows its cross sectional view along A–A' line in FIG. 15. Fundamental structure of the cell array is similar to the embodiment shown in FIG. 13 and FIGS. 14A–14C. The difference between the embodiments are as follows: According to this embodiment, element forming regions each including two cells are separated to have form of island and in each element forming region the two cells share the diffused region 23 of the transistor, which is connected to a bit line 37, however, p+ type emitter region 42 of the thyristor are individually provided for neighboring memory cells. The p+ type emitter region 42 is connected to reference potential (Vref) supply line 41 which is disposed in parallel with the word lines WL1 and WL2.

As disclosed in the second embodiment, when the reference potential Vref is commonly supplied to two neighboring cells, and in the operation to write "0" data in a memory cell, there is a possibility of data breakage because of application of reverse voltage to a non-selected thyristor connected to the same bit line. According to this embodiment, since the Vref can be separately controlled for cells arranged along the bit line, reliable selective writing is realized.

FIG. 17 and FIG. 18 show a variation of the embodiment shown in FIG. 15 and FIG. 16. According to this embodiment, a dummy word line 32a which is formed with gate 32 (TR) of the transistor and gate 32 (TH) of the thyristor at the same time, is arranged on the element isolation insulating film 20 which is formed for every two cells along the bit line. By employing such structure, the reference potential supply line 41 which commonly connects p+ type emitter region 42 can be provided by filling in self alignment manner.

In every embodiments, a thyristor with gate and a transistor which construct SRAM cell is formed in an SOI substrate with the thyrister being in lateral form. Therefore, gate electrodes of the thyristors and of the transistors can be patterned at the same time using the same material, as a result there is formed no large difference in level on the device surface and small cell area can be realized.

What is claimed is:

1. A semiconductor device comprising:
   an SOI substrate having a semiconductor substrate and a semiconductor layer provided over the semiconductor substrate, said semiconductor layer and said semiconductor substrate being insulated with respect to the other by an insulating film;
   a thyristor in which a first emitter region of a first conductivity, a first base region of a second conductivity, a second base region of the first conductivity and a second emitter region are provided laterally in said semiconductor layer, and a first gate electrode connected to a first word line is provided on said second base region;
   a transistor in which a second gate electrode connected to a second word line and a source diffused region and a drain diffused region provided in said semiconductor layer, one of the source and drain diffused region being shared with said second emitter region and the other being connected to a bit line, are provided.

2. The semiconductor device according to claim 1, wherein a plurality of memory cells, each has said thyristor and said transistor, are arranged in matrix form to construct a cell array;
   said first word line and said second word line are arranged in parallel, and said bit line is disposed to cross said first and second word lines on said cell array.

3. The semiconductor device according to claim 2, wherein said semiconductor layer is divided into a plurality of stripe shaped element forming regions isolated by element isolation films;
   and wherein a plurality of memory cells are arranged in each element forming region, and said first emitter region is shared by two neighboring memory cells, and said diffused regions connected to the bit line is also shared by two neighboring memory cells.

4. The semiconductor device according to claim 3, wherein said element isolation film is foamed to have a depth reaching said insulating film under said semiconductor layer.

5. The semiconductor device according to claim 2, wherein said first emitter region is a plug of first conductivity type filed in a hole penetrating said first base region and said insulating film under said first base region and reaching said semiconductor substrate, and said semiconductor substrate is served as said reference potential terminal which is common to a plurality of memory cells.

6. The semiconductor device according to claim 2, wherein said first emitter region is diffused in said first base region in said semiconductor substrate and a reference potential supply line which commonly connects said first emitter region in a direction of said first word line is provided between two neighboring said first word lines.

7. The semiconductor device according to claim 2, wherein said first and second word lines are formed with a relation of Line/Space=F/F where F is minimum process dimension, said bit line is formed with a relation of Line/Space=F/F and are of one memory cell is set to $8F^2$.

8. The semiconductor device according to claim 2, wherein said semiconductor layer of said substrate is divided into a plurality of element forming regions having island shape, and wherein in each element forming region, a plurality of memory cells are arranged in the manner that diffused regions of transistors, the diffused regions being connected to said bit line, are shared by neighboring memory cells, and said first emitter regions are separately formed.

9. The semiconductor device according to claim 8, wherein said first emitter regions are formed in said first base regions of said semiconductor substrate, and a reference potential supply lines to commonly connect said first emitter regions are arranged in a direction of said word lines.

10. The semiconductor device according to claim 9, further comprises dummy word lines arranged in parallel with said reference potential supply lines on said element isolation insulating film which exists between said first emitter regions of said thyristors belonging to neighboring memory cells.

11. A method for manufacturing a semiconductor device having memory cells each having a thyristor with gate and a transistor connected in series with the thyristor, comprising;

defining an element forming region isolated by an element isolation insulation film in a semiconductor layer of a first conductivity type provided on a semiconductor substrate, said semiconductor layer being insulated by an insulation film provided on the semiconductor substrate;

forming a second base region of a first conductivity type in said element forming region;

forming a first gate electrode of the thyristor and a second gate of the transistor above said second base region, said first and second gate electrodes being arranged in parallel;

implanting ions to form a source and drain diffused regions of the second conductivity at both sides of said second gate electrode, and to form, at the same time, a second emitter region of the second conductivity type and a first base region, one of said source and drain diffused regions and said second emitter region being common region;

providing a hole penetrating said first base region and said insulating film under said base region; and filling said hole with material of the first conductivity type to obtain a plug member as a first emitter region which contacts said semiconductor substrate.

12. The method for manufacturing a semiconductor device according to claim 11, wherein said element isolation insulation film is formed by making a trench reaching said insulation film in said semiconductor layer, and by filling said trench with insulating material.

13. The method for manufacturing a semiconductor device according to claim 11, further comprising after implanting ions, forming side wall insulation film at side walls of said first and second gate electrodes, depositing interlayer insulation film and flattening said interlayer insulation film.

14. The method for manufacturing a semiconductor device according to claim 13, wherein said plug member is obtained by forming a hole penetrating said interlayer insulation film, said first base region and said insulating film under the first base region at a location neighboring to said first gate electrode, and by filling the hole with material of first conductivity.

15. A method for manufacturing a semiconductor device having memory cells each having a thyristor with gate and a transistor connected in series with the thyristor, comprising;

defining an element forming region isolated by an element isolation insulation film in a semiconductor layer of a first conductivity type provided on a semiconductor substrate, said semiconductor layer being insulated by an insulation film provided on the semiconductor substrate;

forming a second base region of a first conductivity type in said element forming region;

forming a first gate electrode of the thyristor and a second gate of the transistor above said second base region, said first and second gate electrodes being arranged in parallel;

implanting ions to form a source and drain diffused regions of the second conductivity at both sides of said second gate electrode, and to form, at the same time, a second emitter region of the second conductivity type and a first base region, one of said source and drain diffused regions and said second emitter region being common region; and forming a first emitter region of the first conductivity type of said thyristor in said first base region.

16. The method for manufacturing a semiconductor device according to claim 15, further comprising after implanting ions, forming side wall insulation film at side walls of said first and second gate electrodes, depositing interlayer insulation film and flattening said interlayer insulation film.

17. The method for manufacturing a semiconductor device according to claim 16, wherein said emitter region is obtained by selectively implanting ions into said first base region through a hole formed in said interlayer insulating film at a location neighboring to said first gate electrode.

* * * * *